(12) United States Patent
Schroeder et al.

(10) Patent No.: US 6,897,943 B2
(45) Date of Patent: May 24, 2005

(54) METHOD AND APPARATUS FOR AERIAL IMAGE IMPROVEMENT IN PROJECTION LITHOGRAPHY USING A PHASE SHIFTING APERTURE

(75) Inventors: Uwe Paul Schroeder, Langebrueck (DE); Tobias Mono, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/745,676

(22) Filed: Dec. 21, 2000

(65) Prior Publication Data

US 2004/0207827 A1 Oct. 21, 2004

(51) Int. Cl.[7] .......................... G03B 27/54; G03B 27/72
(52) U.S. Cl. .......................................... 355/71; 355/67
(58) Field of Search .............................. 355/52, 53, 55, 355/67, 71

(56) References Cited

U.S. PATENT DOCUMENTS 5,348,837 A * 9/1994 Fukuda et al. ............... 430/269
5,642,183 A * 6/1997 Sugihara et al. ............... 355/71

* cited by examiner

Primary Examiner—Rodney Fuller
(74) Attorney, Agent, or Firm—Slater & Matsil, L.L.P.

(57) ABSTRACT

A plate 50 for projection lithography comprising a first opaque region 54 located at the center of the plate 50 and a second opaque region 56 formed at the outer edge 52 of the plate. The first and second opaque regions define a light transmissive annular region 58. The annular region 58 comprises a first light transmissive area 60, 62 that imparts a first phase shift to light passing therethrough and a second light transmissive area 64, 66, which imparts a second phase shift to light passing therethrough.

24 Claims, 6 Drawing Sheets

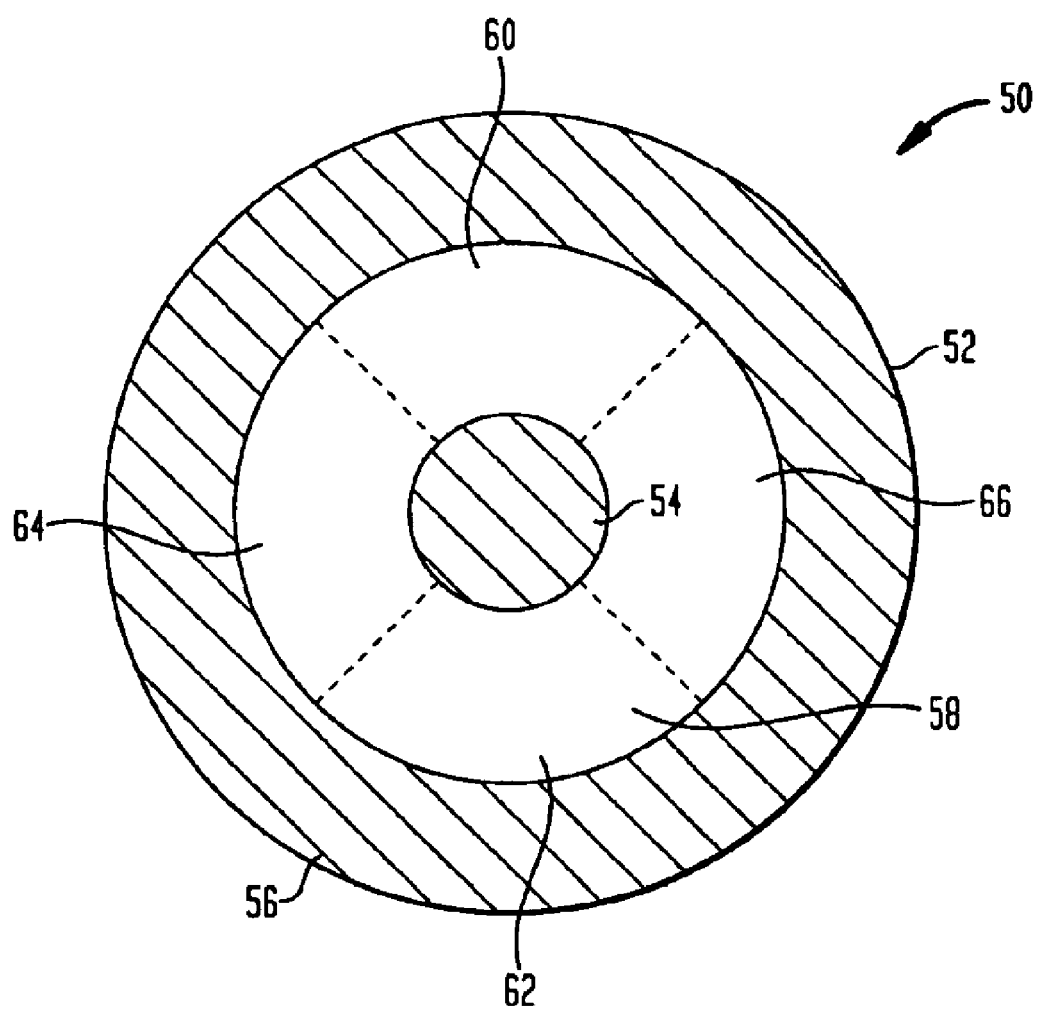

METHOD AND APPARATUS FOR AERIAL IMAGE IMPROVEMENT IN PROJECTION LITHOGRAPHY USING A PHASE SHIFTING APERTURE

TECHNICAL FIELD OF THE INVENTION

This invention relates generally to photolithography for semiconductor fabrication and more particularly to aerial image improvement in projection lithography using phase shifting to produce incoherent light to reduce the effects resulting from side maxima formation.

BACKGROUND OF THE INVENTION

As semiconductor feature sizes continue to shrink into the sub-micron range, the effects of light diffraction during photolithographic processes become more pronounced. Common ultraviolet (UV) exposure tools use light sources having a 193, 248, or 365 nm wavelength. When such tools are used to form semiconductor devices having feature sizes of 70 to 350 nm, the effects of light diffraction become quite pronounced and produce interference that affect printed patterns on the semiconductor device.

One area where interference effects are particularly problematic is with patterns that are placed orthogonally to each other. The interference effects tend to degrade the aerial image, thus limiting the resolution and the photolithography process window. The effects of interference can be seen especially at the edges of array type patterns where lines tend to merge or fall over in these regions more easily. In particular, the interference effects appear as side maxima in the printing of the patterns on a semiconductor wafer, which adversely affect the resolution of printed pattern.

There are prior art solutions that use various methods to improve overall resolution of patterns. Some of the prior art solutions utilize off-axis illumination or phase shifting masks. Off-axis illumination will increase overall resolution by re-focusing some of the light rays that are generally diffracted outside of the line of projection. Phase shifting masks shift the phase of a light beam to produce incoherent light where there is a phase difference between different features. The resolution of features is thus improved. However, the present invention improves the lithographic imaging quality of orthogonally oriented features beyond that which is accomplished by applying only the prior art solutions mentioned above. The present invention consists of a less costly solution that is simple and requires no change to existing photolithographic optics or equipment.

SUMMARY OF THE INVENTION

A cost efficient and simple solution for improving the lithographic imaging quality of orthogonally oriented features is achieved by preferred embodiments of the present invention having a plate having light transmissive regions which provide phase shifting resulting in improved image quality. In one preferred embodiment the plate comprises a first opaque region located at the center of the plate and a second opaque region formed at the outer edge of the plate. The first and second opaque regions define an annular region therebetween. The annular region is light transmissive and comprises a first light transmissive area that imparts a first phase shift to light passing therethrough and a second light transmissive area, which imparts a second phase shift to light passing therethrough.

The present invention also discloses a method of photolithographically imposing a pattern on a semiconductor wafer, comprising the steps of coating the wafer with a resist layer, providing a coherent light illumination source, and deriving incoherent light from the illumination source by passing light from the illumination source through an aperture having an opaque region in its center and having a first light transmissive area that imparts a first phase shift on light passing therethrough and a second light transmissive area that imparts a second phase shift on light passing therethrough. The method further includes the steps of passing the incoherent light through a photomask having a pattern formed thereon and illuminating the resist layer with the incoherent light after the incoherent light has passed through the photomask.

One advantage of the preferred embodiment of the present invention is that it provides a less costly solution to improving the resolution of orthogaonally oriented features.

Another advantage of the present invention is that is requires no change to existing photolithographic optics.

BRIEF DESCRIPTION OF THE DRAWINGS

The above features of the present invention will be more clearly understood from consideration of the following descriptions in connection with accompanying drawings in which:

FIG. 3 illustrates a first preferred embodiment of the present invention;

DETAILED DESCRIPTION OF ILLUSTRATIVE EMBODIMENTS

The making and use of the various embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

Figure 1:
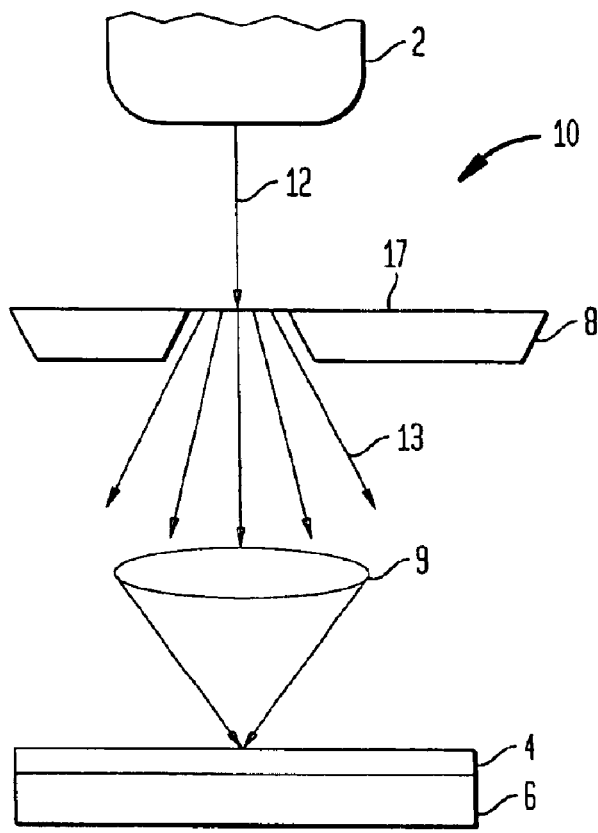
FIG. 1 illustrates a prior art apparatus for photolithographically forming patterned features on the surface of a substrate.

FIG. 1 illustrates a prior art photolithographic apparatus 10. The apparatus comprises a light source 2, a photomask 8, a focusing lens 9, and a photosensitive layer (a photoresist layer) 4 formed on a semiconductor wafer 6 or similar substrate. Patterns are formed on photoresist layer 4 by passing light from light source 2 through a photomask 8 upon which is formed the pattern desired to be transferred. The light also passes through focusing lens 9 prior to impinging upon layer 4. The light that passes through the photomask 8, however, is subject to interference effects which result in diffraction of the light rays 13 originating at the light source 2.

Figure 2A:
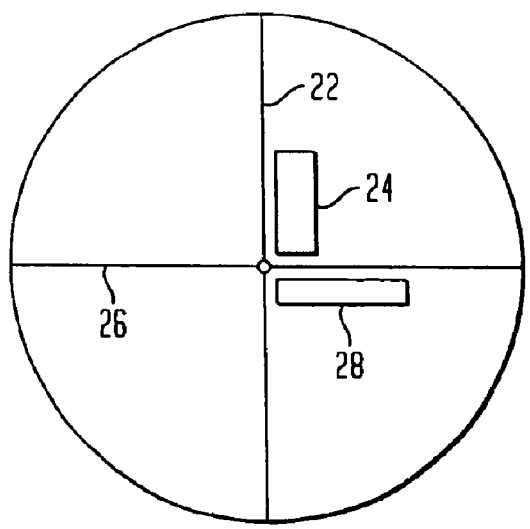
FIG. 2a illustrates exemplary photomask features.
Figure 2B:
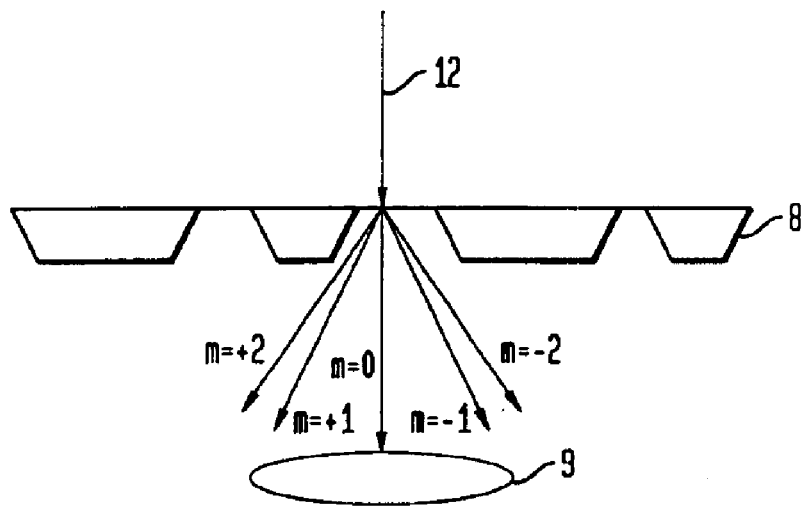
FIGS. 2b and 2c illustrate light diffraction and the resulting side maxima.
Figure 2C:
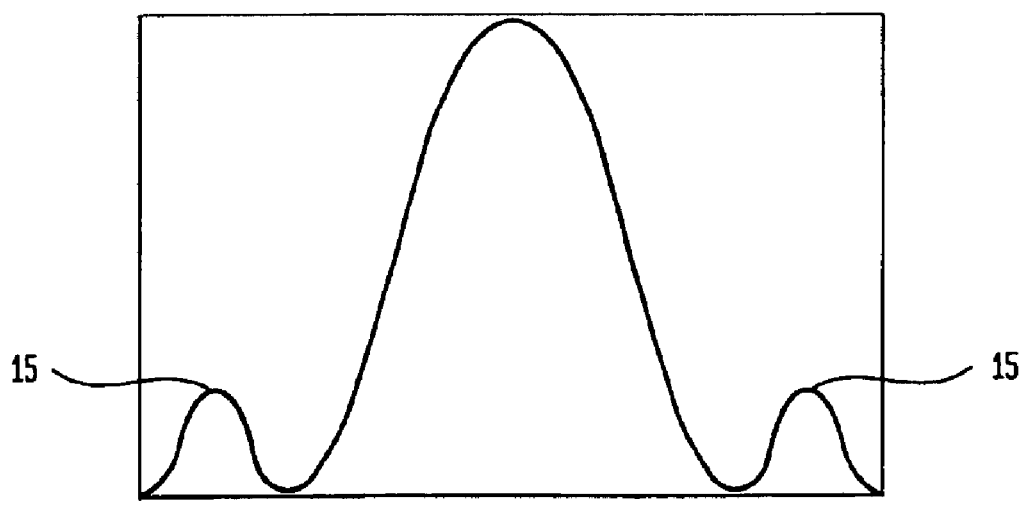

When the light source 2 illuminates the photomask 8, a circular pattern of illumination is formed on the top plane 17 of the photomask 8. This circular pattern is shown in a top down view of the top plane 17 in FIG. 2a. For orthogonal features, the light rays that lie parallel to the axis 22 will define those features such as first feature 24. Light rays that lie parallel to the axis 26 will define features such as second feature 28 which are perpendicular to first feature 24. When the light source 2 illuminates the photomask 8, however, the light rays passing from the photomask which define first and second features 24, 28 on the photomask may be diffracted, as shown in FIG. 2b. The symbol m represents the order of diffraction. An order of zero represents no diffraction and partly diffracted orders are represented by increments along the x-axis (the increments are designated positive and negative to reference their position relative to the y-axis). The diffraction of the light rays result in side maxima 15 having a given intensity as shown in FIG. 2c. The side maxima 15 will decrease the resolution by degrading the contrast of the desired pattern. Furthermore, when the side maxima 15 of first and second features 24 and 28 on the photomask 8 overlap, the side maxima 15 add together coherently which further degrades the contrast of the desired pattern.

FIG. 3 illustrates a first preferred embodiment of the aperture of the present invention which decreases the effects of overlapping side maxima resulting from the diffraction of light. A plate 50, sometimes referred to herein as a phase aperture or as an aperture, for aerial image improvement has a substantially circular shape and an outer edge 52. The plate may be made of, but is not limited to, quartz glass. The plate 50 includes a first opaque region 54 having a substantially circular shape located at the center of the plate 50. A second opaque region 56 is formed between the first opaque region 54 of the plate 50 and the outer edge 52 of the plate 50. An annular region 58 is formed around the plate 50 by the first opaque region 54 and second opaque region 56. The annular region 58 is divided into a first, second, third, and fourth sector 60,62,64, and 66, respectively. These light transmissive sectors are formed by varying the thickness of the aperture material which will impart the desired phase shifts as described below.

The first and second sectors 60, 62, respectively, are located opposite from each other and are preferably substantially vertically oriented. Sectors 60, 62 have a thickness, $t_1$, and are designed to impart a first phase shift $\Theta_1$ to light passing through first and second sectors 60,62. The third and fourth sectors 64, 66, respectively, are also located opposite each other and are preferably substantially horizontally oriented. The third and fourth sectors 64, 66 have a second thickness, $t_2$, and impart a second phase shift $\Theta_2$ to the light passing through these sectors. The first phase shift $\Theta_1$ is not equal to the second phase shift, which results in a phase difference $\Theta_A$. The phase difference $\Theta_A$ is preferably in the range of 45°–315° and more preferably about 180°. It should be appreciated by those skilled in the art that the phase difference $\Theta_A$ may be adjusted as necessary to produce the best resolution.

In the preferred embodiment, thicknesses $t_1$ and $t_2$ are in the order of 0.1 mm up to 1.0 mm with a thickness difference abs($t_1$ minus $t_2$) equal to $1/(2n_{ref})$ wavelengths of the light emanating from illumination source 2 ($n_{ref}$ is the refractive index of the material used for the plate 50). In this way, the preferred phase shift difference $\Theta_A$ is imparted to light passing through sectors 60, 62 relative to sectors 64, 66.

Figure 4:
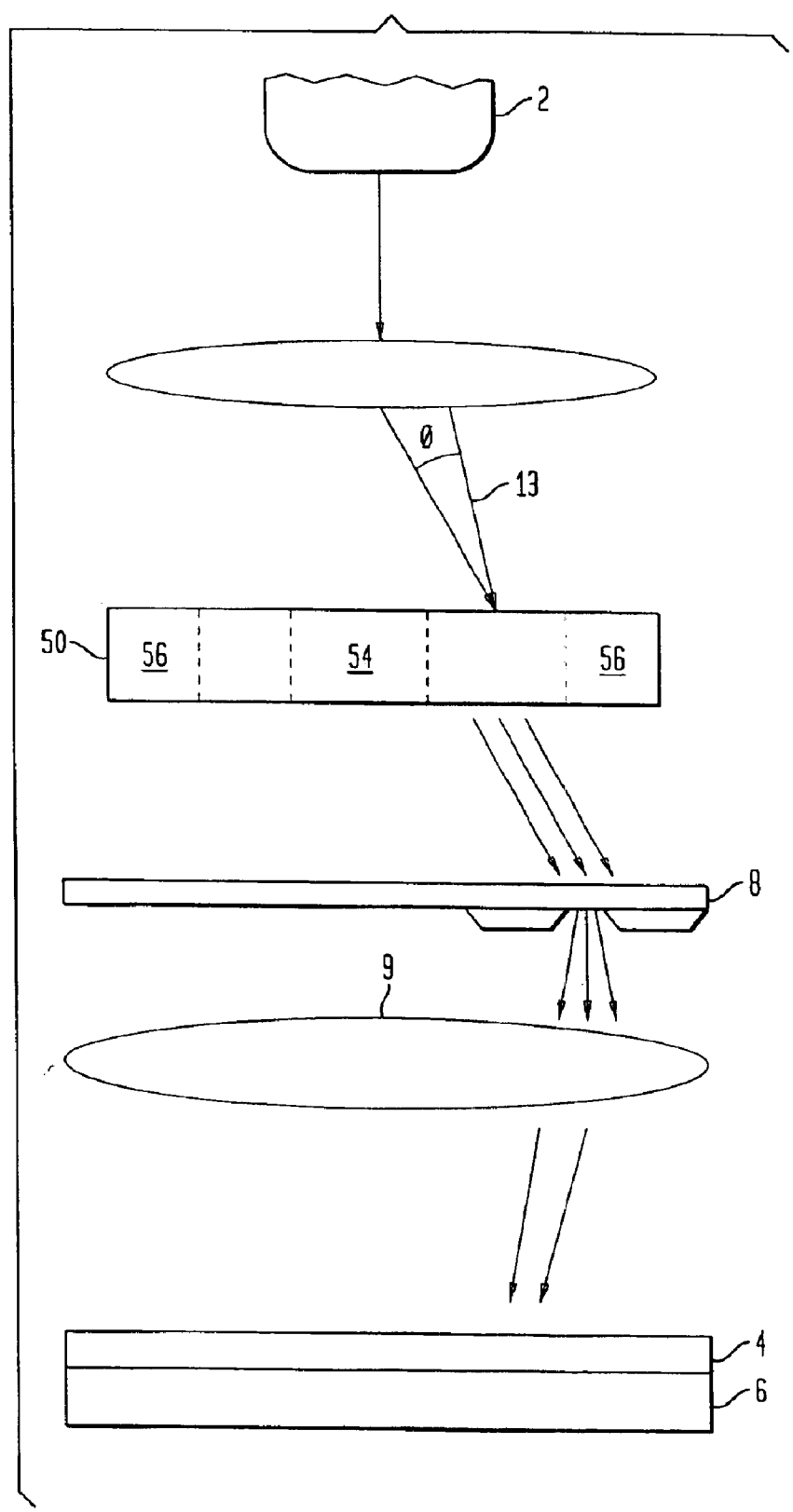
FIG. 4 shows a system for photolithographically forming patterned features on the surface of a substrate utilizing a preferred embodiment of the present invention.

In operation, the preferred embodiment of the present invention is implemented as an aperture 50 in the apparatus shown in FIG. 4. The aperture 50 provides off-axis illumination. In off-axis illumination, nth order light rays, both positive and negative, are utilized to improve resolution of pattern features. Note that light rays 13 being in and close to the y-axis are blocked by opaque region 54 of aperture 50. Light rays closer to the outer edge 52 (as shown in FIG. 3) of the aperture 50 are also blocked by ring-shaped opaque region 56 of aperture 50. Only light rays passing through annular region 58, comprised of sectors 60, 62, 64, and 66, pass through to impinging upon photomask 8. These light rays impinge upon photomask 8 at an angle, as shown. By illuminating the photomask 8 at an angle σ off the y-axis, light rays, which are usually diffracted outside of the focusing lens 9, pass through the aperture 50 to the focusing lens 9. Note that by using an annular opening region 58, off-axis illumination is provided for any feature on photomask 8, regardless of the orientation of that feature (i.e. vertical, horizontal, or at an angle to the vertical or horizontal). The annular region 58 of the aperture 50 results in the improved resolution of any orthogonal features because both positive and negative nth order light rays in any direction around the annular region will be captured by the focusing lens 9.

While the resolution is improved by capturing the diffracted light in the annular region 58, the resolution between orthogonal features can be further improved. The phase difference $\Theta_A$ introduced by the four sectors 60, 62, 64, and 66 as described above provides improved resolution to the orthogonal lines by having the intensities of the light passing through the different features of the photomask 8 incoherently overlap. For coherent object illumination all points in the object have wave amplitudes with fixed phase relationships. When the phases vary independently from point to point, the illumination is incoherent. By introducing the phase difference $\Theta_A$, the light illumination becomes incoherent and the resolution is further improved by reduction of the affects of the side maxima formation as described below.

Figure 5A:
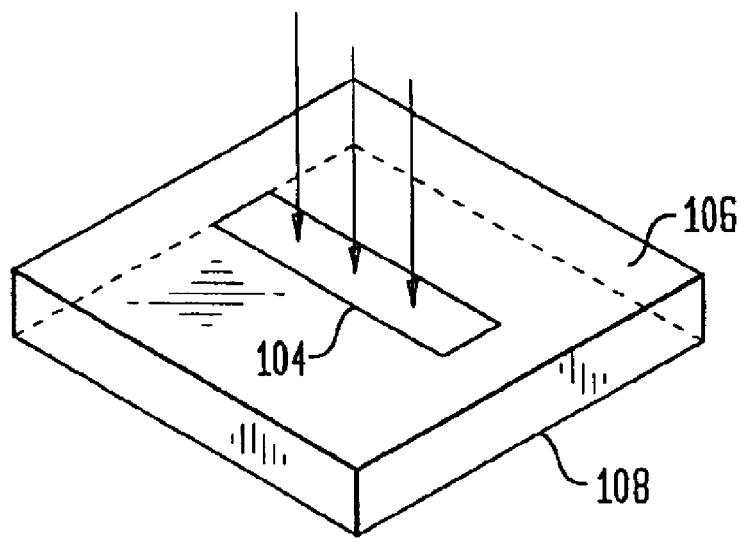
FIGS. 5a and 5b illustrate pattern gratings for pattern features.
Figure 5B:
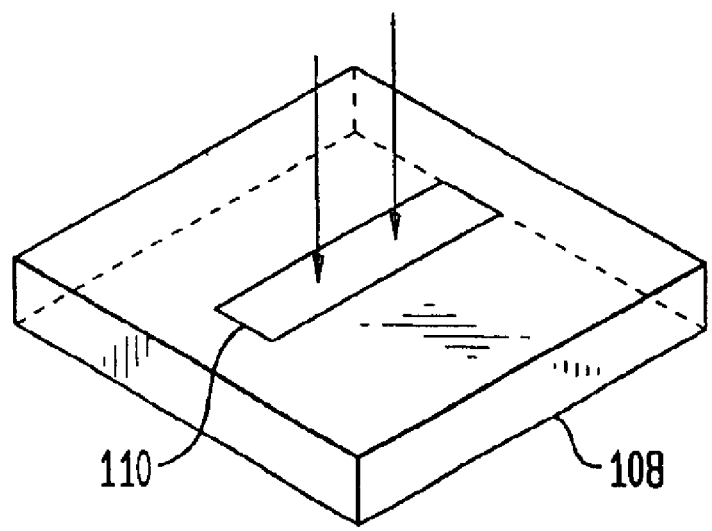
Figure 6:
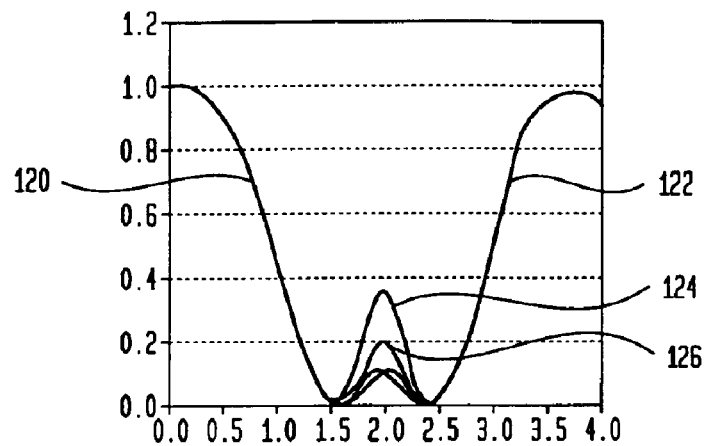
FIG. 6 illustrates the intensity profiles with side maxima and coherent and incoherent overlap.

FIG. 6 illustrates the light intensity profiles with overlapping side maxima for features illuminated with coherent light and incoherent light A first intensity profile is represented by line 120. Line 120 represents the light intensity of a mask feature in a horizontal direction, such as feature 104 on a surface 106 of photomask 108 of FIG. 5a. Line 122 represents the intensity profile of a vertical mask feature, such as feature 110 of FIG. 5b. One skilled in the art will recognize that in actual practice, both feature 104 and feature 110 will be formed on the same photomask. The distortion or side maxima which results in degrading the contrast of the image (here, the contrast between orthogonal lines) is represented by lines 124 and 126. The side maxima overlap in a naturally coherent fashion. In other words the light wave characteristics are the same for both of the features (horizontal and vertical). The coherent overlap is represented by line 124. Mathematically, the overlap intensity is represented as $\alpha \ (E_1+E_2)^2$, where E represents the amplitude of the electrical field of the light wave.

When the present invention is utilized, by imposing a phase shift between light that is refracted in the substantially vertical direction and light that is refracted in the substantially horizontal direction, the side maxima for such vertical and horizontally oriented features overlap in an incoherent fashion, as represented by line 126. As evident from the figure, the side maxima is significantly smaller, thus the resolution is significantly improved. The incoherent overlap is equal to $I_1+I_2\alpha(E_1^2+E_2^2)$. Thus, the light intensity in those regions where the side maxima overlap is decreased, although not eliminated, to improve contrast and provide improved resolution.

Further detail regarding the design and manufacture of the preferred embodiment apertures is now provided. As discussed above, aperture 50 is preferably formed of quartz glass, although other optical quality materials with similar optical characteristics could be substituted. Preferably the aperture is nominally between 0.01 cm to 0.1 cm in thickness and typically between 0.3 and 3 cm in diameter. Opaque regions 54 and 56 are preferably formed by coating a top surface of plate 50 with a thin coating of chromium or other well known light blocking films, and patterning the coating using well known photolithographic techniques.

The sectors 60, 62, 64, and 66 are preferably formed by grinding plate 50 to the desired thickness using mechanical polishing or etching techniques. Alternatively, the sectors can be built up to a desired thickness by using an optically compatible coating. In the preferred embodiments the sectors 60, 62, 64, and 66 are formed by etching techniques.

Figure 7:
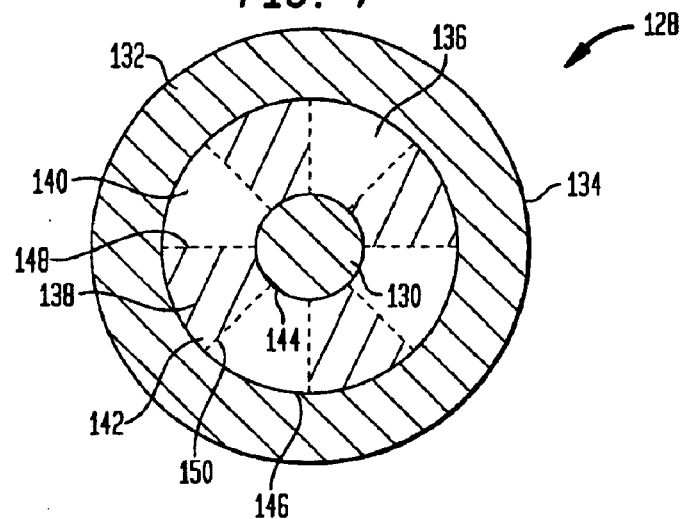
FIGS. 7 and 8 are other preferred embodiments of the present invention.

FIG. 7 illustrates another preferred embodiment of the present invention. FIG. 7 shows a plate 128 that includes a substantially circular first opaque region 130 located in the center of the plate 128 and a second opaque region 132 located along the diameter of the outer edge 134 of the plate 128. The first and second opaque regions 130, 132 form an annular opening 136. Within the annular opening 136 is formed four opaque sectors 138 alternately placed between four light transmissive sectors 140. Each of the four opaque sectors 138 has a first and a second edge 142 and 144, respectively. The first edge 142 of each opaque sector 138 is formed by the first edge 146 of the annular opening 136. The second edge 144 of each opaque sector 138 is seamlessly integrated into the second opaque sector 132. The third and fourth edges 148 and 150, respectively, of the four opaque sectors 138 form the adjacent edges of the four light transmissive sectors 140.

In this case, the light transmissive sectors 140 of the aperture located opposite of each other have the same plate thickness, and neighboring transmissive sectors have plates with a thickness difference equal to $1/(2n_{ref})$ wavelengths of the light emanating from illumination source 2 ($n_{ref}$ is the refractive index of the material used for the plate 128)

Figure 8:
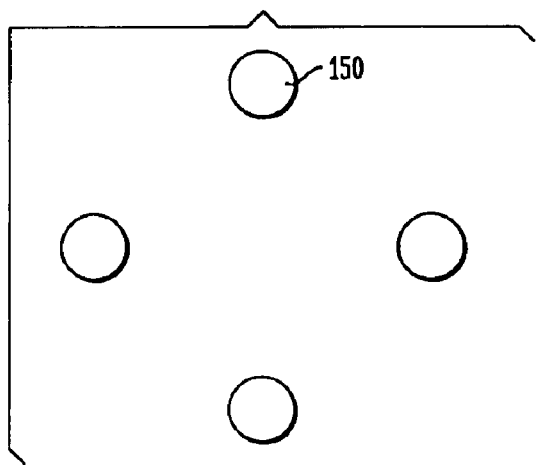

Another embodiment of the present invention is shown in FIG. 8. In this embodiment, instead of ring segment openings, such as the sectors 140, circular openings 150 are used to accomplish the off-axis illumination. The material thickness of the circular openings are similar to the material thickness of the ring segment openings as discussed above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plate for projection lithography comprising:
    a first opaque region located at the center of the plate; and
    a second opaque region formed at an outer edge of the plate, said first and second opaque regions defining an annular region therebetween, said annular region being light transmissive and comprising a first light transmissive area that imparts a first phase shift to light passing therethrough and a second light transmissive area, which imparts a second phase shift to light passing therethrough.

2. The plate of claim 1 wherein said first light transmissive area comprises two opposed regions being substantially vertically oriented and on opposed portions of said annular region.

3. The plate of claim 1 wherein said second light transmissive area comprises two opposed regions being substantially horizontally oriented and on opposed portions of said annular region.

4. The plate of claim 1 wherein said second phase shift differs from said first phase shift by between 45 degrees and 315 degrees.

5. The plate of claim 4 wherein said second phase shift differs from said first phase shift by 180 degrees.

6. The plate of claim 1 wherein said first light transmissive area has a first thickness and said second light transmissive area has a second thickness and the difference between said first and second light transmissive areas is equal to $1/(2n_{ref})$ wavelengths of an illuminating light source.

7. A plate for projection lithography comprising:
    an opaque region; and
    a first, second, third, and fourth light transmissive region formed around the periphery of said plate, said first and second light transmissive regions substantially vertically oriented and oppositely located and imparting a first phase shift to light passing therethrough, said third and fourth light transmissive regions substantially horizontally oriented and oppositely located and imparting a second phase shift to light passing therethrough.

8. The plate of claim 7 wherein said second phase shift differs from said first phase shift by between 45 degrees and 315 degrees.

9. The plate of claim 8 wherein said second phase shift differs from said first phase shift by 180 degrees.

10. The plate of claim 7 wherein said first and second light transmissive regions have a first thickness and said third and fourth light transmissive regions have a second thickness and the difference between said first and second and said third and fourth light transmissive regions is equal to $1/(2n_{ref})$ wavelengths of an illuminating light source.

11. An aperture plate for use in a photolithographic system, comprising:
    a plate including:
        an opaque region in the center of the plate;
        a first light transmissive region;
        a second light transmissive region located substantially opposite said first light transmissive region;
        a third light transmissive region; and
        a fourth light transmissive region located substantially opposite said third light transmissive region;
        wherein light passing through said third and fourth light transmissive regions is phase shifted by a phase difference from light passing through said first and second light transmissive regions.

12. The aperture plate of claim 11 further comprising a second opaque region located along an outer portion of said plate and wherein said opaque region and second opaque region define an annular region therebetween.

13. The aperture plate of claim 11 wherein said first, second, third, and fourth light transmissive regions are formed within said light transmissive region.

14. The aperture plate of claim 11 wherein said plate is formed of glass.

15. The aperture plate of claim 11 wherein said opaque region is comprised of a chromium film.

16. The aperture plate of claim 11 wherein said first and second light transmissive regions have a first thickness and said third and fourth light transmissive regions have a second thickness.

17. A system for projection lithography comprising:
    a light source for illumination;
    a photomask having formed thereon a pattern;

a focusing lens adjacent to said photomask and aligned to be illuminated by light passing through said photomask; and an aperture comprising:
- a plate;
- an opaque region located substantially at the center of said plate; and
- a first light transmissive area that imparts a first phase shift to light passing therethrough and a second light transmissive area, which imparts a second phase shift to light passing therethrough.

18. The system of claim 17 wherein said first light transmissive area comprises a first and second sector being substantially vertically aligned and located substantially oppositely on said plate and wherein said second light transmissive area comprises a third and fourth sector being substantially horizontally aligned and located substantially oppositely on said plate.

19. The system of claim 18 wherein said first phase shift or said second phase shift is zero degrees.

20. The system of claim 17 wherein said first phase shift and said second phase shift differ by between 45 and 315 degrees.

21. The system of claim 17 wherein said aperture comprises an annular aperture and said first and second light transmissive areas are formed within a light transmissive annular region of said aperture.

22. A method of photolithographically imposing a pattern on a semiconductor wafer, comprising the steps of:
- coating the wafer with a resist layer;
- providing a coherent light illumination source;
- deriving incoherent light from said illumination source by passing light from said illumination source through an aperture, the aperture having an opaque region in its center and having a first light transmissive area that imparts a first phase shift on light passing therethrough and a second light transmissive area that imparts a second phase shift on light passing therethrough;
- passing said incoherent light through a photomask having a pattern formed thereon; and
- illuminating the resist layer with the incoherent light after the incoherent light has passed through said photomask.

23. The method of claim 22 wherein said first phase shift is zero degrees.

24. The method of claim 22 wherein said first phase shift and said second phase shift differ by between 45 degrees and 315 degrees.

* * * * *